United States Patent
Lu et al.

(10) Patent No.: US 10,613,344 B2
(45) Date of Patent: Apr. 7, 2020

(54) 3D DISPLAY APPARATUS AND METHOD FOR DRIVING THE 3D DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengcheng Lu, Beijing (CN); Xiaochuan Chen, Beijing (CN); Ming Yang, Beijing (CN); Wenqing Zhao, Beijing (CN); Lei Wang, Beijing (CN); Qian Wang, Beijing (CN); Rui Xu, Beijing (CN); Jian Gao, Beijing (CN); Xiaochen Niu, Beijing (CN); Haisheng Wang, Beijing (CN); Shengji Yang, Beijing (CN); Chengfeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 137 days.

(21) Appl. No.: 15/504,017

(22) PCT Filed: May 11, 2016

(86) PCT No.: PCT/CN2016/081668
§ 371 (c)(1),
(2) Date: Feb. 14, 2017

(87) PCT Pub. No.: WO2017/140042
PCT Pub. Date: Aug. 24, 2017

(65) Prior Publication Data
US 2018/0107008 A1    Apr. 19, 2018

(30) Foreign Application Priority Data

Feb. 16, 2016 (CN) .......................... 2016 1 0087664

(51) Int. Cl.
*G02B 27/22* (2018.01)
*H01L 27/32* (2006.01)
(Continued)

(52) U.S. Cl.
CPC ............. *G02B 30/00* (2020.01); *G02B 30/27* (2020.01); *H01L 27/32* (2013.01);
(Continued)

(58) Field of Classification Search
None
See application file for complete search history.

(56) References Cited

U.S. PATENT DOCUMENTS

| 6,094,216 A | 7/2000 | Taniguchi et al. |
| 6,246,451 B1 | 6/2001 | Matsumura et al. |

(Continued)

FOREIGN PATENT DOCUMENTS

| CN | 102067612 A | 5/2011 |
| CN | 102768823 A | 11/2012 |

(Continued)

OTHER PUBLICATIONS

International Search Report and Written Opinion (including English translation of Box V) dated Oct. 31, 2016, for corresponding PCT Application No. PCT/CN2016/081668.
(Continued)

*Primary Examiner* — Ricky Chin
(74) *Attorney, Agent, or Firm* — Kinney & Lange, P.A.

(57) ABSTRACT

Embodiments of the present application provide a 3D display apparatus and a method for driving the same. The apparatus includes: a backlight assembly forming bright
(Continued)

stripes and dark stripes arranged alternately; a liquid crystal display panel displaying a left eye image of a 3D display signal by a first set of pixel units and display a right eye image by a second set of pixel units; a location tracking unit acquiring a location of a viewer; and a control unit adjusting position of the bright and dark stripes and deflection of liquid crystal of the liquid crystal display panel such that a light emitted from the bright stripes is allowed to pass through corresponding first set to be received by left eye and to pass through corresponding second set to be received by right eye respectively. Embodiments are used in manufacturing of a 3D display apparatus.

11 Claims, 6 Drawing Sheets

(51) Int. Cl.
| | | |
|---|---|---|
| H04N 13/366 | (2018.01) | |
| H04N 13/32 | (2018.01) | |
| H04N 13/376 | (2018.01) | |
| G02F 1/1335 | (2006.01) | |
| G02B 30/00 | (2020.01) | |
| G02B 30/27 | (2020.01) | |

(52) U.S. Cl.
CPC ......... *H01L 27/3232* (2013.01); *H04N 13/32* (2018.05); *H04N 13/366* (2018.05); *H04N 13/376* (2018.05); *G02F 1/133603* (2013.01)

(56) References Cited

U.S. PATENT DOCUMENTS

| | | | | |
|---|---|---|---|---|
| 8,866,979 | B2* | 10/2014 | Wu | G02B 27/2214 349/114 |
| 9,167,234 | B2* | 10/2015 | Hirakata | G02B 27/225 |
| 2006/0125977 | A1* | 6/2006 | Park | G02B 3/005 349/95 |
| 2007/0086090 | A1* | 4/2007 | Wang | G02B 27/225 359/464 |
| 2007/0164950 | A1 | 7/2007 | Tajiri | |
| 2007/0206134 | A1 | 9/2007 | Sung et al. | |
| 2007/0236619 | A1* | 10/2007 | Kuo | G02B 27/2214 349/15 |
| 2008/0231952 | A1* | 9/2008 | Kim | G02B 27/2214 359/465 |
| 2012/0002444 | A1* | 1/2012 | Kim | G02B 6/0036 362/613 |
| 2012/0105749 | A1* | 5/2012 | Tseng | G02B 27/2242 349/15 |
| 2012/0105953 | A1* | 5/2012 | Huang | G02B 27/2214 359/462 |
| 2012/0140131 | A1* | 6/2012 | Lanman | G02B 27/2214 349/15 |
| 2013/0050817 | A1* | 2/2013 | Sumi | G02B 27/2214 359/463 |
| 2013/0100175 | A1* | 4/2013 | Koito | G02B 27/2214 345/690 |
| 2013/0176203 | A1* | 7/2013 | Yun | G02B 27/2214 345/156 |
| 2013/0265510 | A1* | 10/2013 | Fang | G02B 27/22 349/15 |
| 2013/0293793 | A1* | 11/2013 | Lu | G02B 27/2214 349/15 |
| 2014/0063385 | A1* | 3/2014 | Yang | G06F 3/044 349/15 |
| 2014/0118822 | A1* | 5/2014 | Wu | G02B 27/2214 359/462 |
| 2014/0355113 | A1* | 12/2014 | Pan | G02B 27/2214 359/462 |
| 2014/0355250 | A1* | 12/2014 | Tyan | G02B 5/0226 362/97.1 |
| 2014/0375707 | A1* | 12/2014 | Wu | G02B 27/2228 345/697 |
| 2015/0084018 | A1* | 3/2015 | Zhou | H01L 27/3211 257/40 |
| 2015/0093040 | A1* | 4/2015 | Zhou | H04N 5/2351 382/274 |
| 2015/0138455 | A1* | 5/2015 | Liao | G02B 27/2214 349/15 |
| 2015/0227112 | A1* | 8/2015 | Liu | G02B 27/225 348/40 |
| 2015/0364075 | A1* | 12/2015 | Sato | G09G 3/007 345/698 |
| 2015/0370078 | A1* | 12/2015 | Shang | G02B 27/2214 362/97.1 |
| 2016/0085019 | A1* | 3/2016 | Yang | G02B 6/0038 362/611 |
| 2016/0182899 | A1* | 6/2016 | Liu | G02F 1/155 348/54 |
| 2016/0240118 | A1* | 8/2016 | Ray | G02B 27/225 |
| 2016/0240603 | A1* | 8/2016 | Park | G02F 1/13 |
| 2016/0253013 | A1* | 9/2016 | Yang | G06F 3/041 345/173 |
| 2016/0320545 | A1* | 11/2016 | Hirayama | G02B 6/0038 |
| 2017/0038636 | A1* | 2/2017 | Yu | G02F 1/133514 |
| 2017/0125502 | A1* | 5/2017 | Ota | G02B 27/017 |
| 2017/0125503 | A1* | 5/2017 | Ota | H01L 27/3248 |
| 2017/0148396 | A1* | 5/2017 | Chen | G09G 3/2003 |
| 2018/0059427 | A1* | 3/2018 | Yin | G02B 27/2214 |

FOREIGN PATENT DOCUMENTS

| | | |
|---|---|---|
| CN | 104536145 A | 4/2015 |
| CN | 104777621 A | 7/2015 |
| CN | 105093543 A | 11/2015 |
| CN | 105093546 A | 11/2015 |
| CN | 105093553 A | 11/2015 |
| CN | 105467604 A | 4/2016 |

OTHER PUBLICATIONS

First Chinese Office Action dated Aug. 14, 2017, for corresponding Chinese Application No. 10610087664.5.

\* cited by examiner

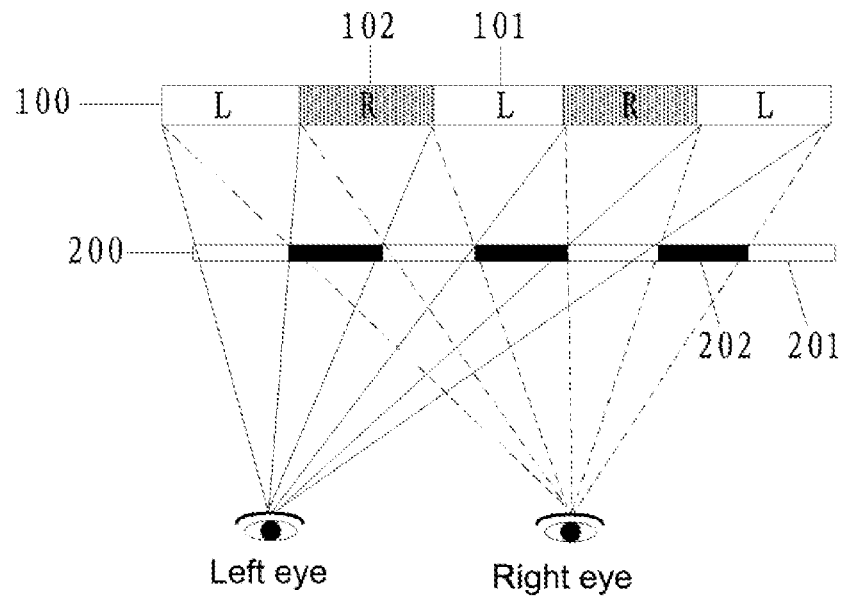
Fig.1 (the prior art)
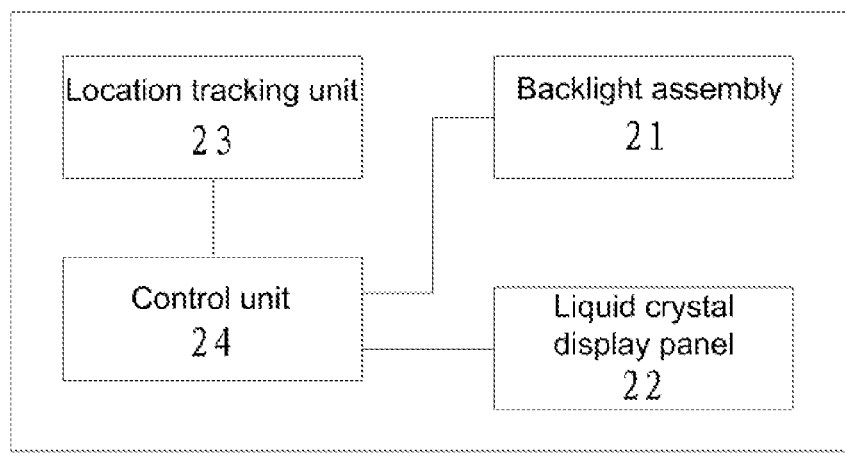
Fig.2

3D DISPLAY APPARATUS AND METHOD FOR DRIVING THE 3D DISPLAY APPARATUS

CROSS-REFERENCE TO RELATED APPLICATION

This application claims benefit of the Chinese Application No. 201610087664.5, filed with SIPO on Feb. 16, 2016, which is incorporated herein by reference in their entirety.

BACKGROUND OF THE DISCLOSURE

Field of the Disclosure

The present disclosure relates to the technical field of display, and in particular, to a 3D display apparatus and a method for driving the 3D display apparatus.

Description of the Related Art

In recent years, three dimensional (3D) display technology develops rapidly. In comparison with the conventional two dimensional display, the 3D display technology may provide a picture which is solid and vivid. In this way, images are not limited in a plane of a display screen any longer such that viewers would have an immersed sense. The 3D display technology includes two category, i.e., glasses type and naked eyes type. The naked eyes type 3D display technology becomes more attentive than the glasses type 3D display technology because glasses are not necessary for the naked eyes type 3D display technology.

A naked eyes type 3D display apparatus in the prior art is illustrated in FIG. 1. It includes a display panel 100 and a gating 200 located at a light exit side of the display panel. The display panel 100 includes a plurality of first display units 101 and a plurality of second display units 102 arranged alternately. The first display units 101 receive a left eye image signal L. The second display units 102 receive a right eye image signal R. The grating 200 has transparent regions 201 and shielding regions 202 arranged alternately, for splitting a light beam passing through the display screen 100 such that the left eye of the viewer receives the light emitted from the first display units 101 to see a left eye image and the right eye of the viewer receives the light emitted from the second display units 102 to see a right eye image. The left eye image and the right eye image are combined by the brain to produce a solid sense.

SUMMARY

Embodiment of the present application provide a 3D display apparatus and a method for driving the 3D display apparatus, so as to alleviate the problem that a viewer for the 3D display apparatus in the prior art can not adjust his viewing locations freely.

An embodiment of the present application provides a 3D display apparatus including: a backlight assembly which includes a plurality of light emitting units arranged in array to form a plurality of bright stripes and dark stripes arranged alternately by lighting part of the plurality of light emitting units, each of the bright stripes and dark stripes being formed by at least one column of light emitting units; a liquid crystal display panel located at a light exit side of the backlight assembly, the liquid crystal display panel including a plurality of pixel units arranged in array to receive a 3D display signal and display a left eye image of the 3D display signal by a first set of the pixel units and display a right eye image of the 3D display signal by a second set of the pixel units, wherein the first set of the pixel units and the second set of the pixel units are arranged alternately and each includes at least one column of the pixel units; a location tracking unit configured to acquire a location of a viewer; and a control unit configured to adjust positions of the bright stripes and dark stripes formed by the backlight assembly and deflection of liquid crystal of the liquid crystal display panel on the basis of the location of the viewer such that light emitted from the bright stripes is allowed to pass through corresponding first set of the pixel units to be received by left eye of the viewer and light emitted from the bright stripes is allowed to pass through corresponding second set of the pixel units to be received by right eye of the same viewer.

In an embodiment, each of the dark stripes between adjacent bright stripes and the bright stripes between adjacent dark stripes includes N columns of the light emitting units, where N is a positive integer greater than 1.

In an embodiment, the light emitting units of the backlight assembly are configured to produce white light and the liquid crystal display panel includes a color filter layer which includes a red color filter, a green color filter and a blue color filter; or the light emitting units of the backlight assembly are configured to produce red light, green light and blue light.

In an embodiment, the light emitting units of the backlight assembly are formed of an OLED light emitting assembly.

In an embodiment, the OLED light emitting assembly includes a first transparent substrate and a second transparent substrate as well as respective light emitting units arranged in parallel between the first transparent substrate and the second transparent substrate, and wherein each of the light emitting units includes a cathode, an anode and an organic electroluminescent portion between the cathode and the anode.

In an embodiment, within the OLED light emitting assembly, the anode of each of the light emitting units is separated from that of any other one of the light emitting units and the cathode of each of the light emitting units is separated from that of any other one of the light emitting units; or the anode of each of the light emitting units is separated from that of any other one of the light emitting units and the cathodes of the light emitting units are electrically connected with each other; or the cathode of each of the light emitting units is separated from that of any other one of the light emitting units and the anodes of the light emitting units are electrically connected with each other.

In an embodiment, the OLED light emitting assembly includes: a first light emitting module forming odd columns of light emitting units of the backlight assembly; and a second light emitting module forming even columns of light emitting units of the backlight assembly.

In an embodiment, the OLED light emitting assembly further includes: a first transparent substrate, a second transparent substrate and an insulation layer located between the first transparent substrate and the second transparent substrate, the first light emitting module being located between the first transparent substrate and the insulation layer, the second light emitting module being located between the insulation layer and the second transparent substrate, and wherein the first light emitting module includes a first cathode layer, a first organic electroluminescent layer and a first anode layer arranged sequentially between the first transparent substrate and the insulation layer; and the second light emitting module includes a second cathode layer, a second organic electroluminescent layer and a second anode layer arranged sequentially between the insulation layer and the second transparent substrate.

In an embodiment, each of the light emitting units includes a cathode, an anode and an organic electroluminescent portion located between the cathode and the anode, and the cathode, the organic electroluminescent portion and the anode of each light emitting unit in the odd columns of light emitting units of the backlight assembly are formed by the first cathode layer, the first organic electroluminescent layer and the first anode layer respectively and the cathode, the organic electroluminescent portion and the anode of each light emitting unit in the even columns of light emitting units of the backlight assembly are formed by the second cathode layer, the second organic electroluminescent layer and the second anode layer respectively, wherein in a same one of the first light emitting module and the second light emitting module, the anode of each of the light emitting units is separated from that of any other one of the light emitting units and the cathode of each of the light emitting units is separated from that of any other one of the light emitting units; or wherein in a same one of the first light emitting module and the second light emitting module, the anode of each of the light emitting units is separated from that of any other one of the light emitting units and the cathodes of the light emitting units are electrically connected with each other; or wherein in a same one of the first light emitting module and the second light emitting module, the cathode of each of the light emitting units is separated from that of any other one of the light emitting units and the anodes of the light emitting units are electrically connected with each other.

In an embodiment, the OLED light emitting assembly includes: a first light emitting module forming $(3n)^{th}$ columns of light emitting units of the backlight assembly; a second light emitting module forming $(3n-1)^{th}$ columns of light emitting units of the backlight assembly; and a third light emitting module forming $(3n-2)^{th}$ columns of light emitting units of the backlight assembly, wherein n is a positive integer.

In an embodiment, the OLED light emitting assembly further includes: a first transparent substrate, a second transparent substrate, and a first insulation layer and a second insulation layer located between the first transparent substrate and the second transparent substrate, the first light emitting module being located between the first transparent substrate and the first insulation layer, the second light emitting module being located between the first insulation layer and the second insulation layer, the third light emitting module being located between the second insulation layer and the second transparent substrate, and wherein the first light emitting module includes a first cathode layer, a first organic electroluminescent layer and a first anode layer arranged sequentially between the first transparent substrate and the first insulation layer, and the second light emitting module includes a second cathode layer, a second organic electroluminescent layer and a second anode layer arranged sequentially between the first insulation layer and the second insulation layer, and the third light emitting module includes a third cathode layer, a third organic electroluminescent layer and a third anode layer arranged sequentially between the second insulation layer and the second transparent substrate.

In an embodiment, each of the light emitting units includes a cathode, an anode and an organic electroluminescent portion located between the cathode and the anode, the cathode, the organic electroluminescent portion and the anode of each light emitting unit in the $(3n)^{th}$ columns of light emitting units of the backlight assembly are formed by the first cathode layer, the first organic electroluminescent layer and the first anode layer respectively, the cathode, the organic electroluminescent portion and the anode of each light emitting unit in the $(3n-1)^{th}$ columns of light emitting units of the backlight assembly are formed by the second cathode layer, the second organic electroluminescent layer and the second anode layer respectively, and the cathode, the organic electroluminescent portion and the anode of each light emitting unit in the $(3n-2)^{th}$ columns of light emitting units of the backlight assembly are formed by the third cathode layer, the third organic electroluminescent layer and the third anode layer respectively; wherein in a same one of the first light emitting module, the second light emitting module and the third light emitting module, the anode of each of the light emitting units is separated from that of any other one of the light emitting units and the cathode of each of the light emitting units is separated from that of any other one of the light emitting units; or wherein in a same one of the first light emitting module, the second light emitting module and the third light emitting module, the anode of each of the light emitting units is separated from that of any other one of the light emitting units and the cathodes of the light emitting units are electrically connected with each other; or wherein in a same one of the first light emitting module, the second light emitting module and the third light emitting module, the cathode of each of the light emitting units is separated from that of any other one of the light emitting units and the anodes of the light emitting units are electrically connected with each other.

In an embodiment, the OLED light emitting assembly is a PMOLED light emitting assembly or an AMOLED light emitting assembly.

An embodiment of the present application provides a method for driving the 3D display apparatus according to any one of the above embodiments, the method including: acquiring a location of a viewer; adjusting positions of the bright stripes and dark stripes formed by the backlight assembly and deflection of liquid crystal of the liquid crystal display panel on the basis of the location of the viewer such that light emitted from the bright stripes is allowed to pass through corresponding first set of the pixel units to be received by left eye of the viewer and light emitted from the bright stripes is allowed to pass through corresponding second set of the pixel units to be received by right eye of the viewer.

BRIEF DESCRIPTION OF THE DRAWINGS

In order that the solutions of embodiments of the present application or the prior art may become more explicit, the drawings that are needed to describe the embodiments or the prior art will below be explained briefly. Apparently, the following drawings only show some of embodiments of the present application. The skilled person in the art also may obtain other drawings from these drawings without any creative efforts.

FIG. 1 is a schematic view showing a structure of a 3D display apparatus in the prior art;

FIG. 2 is a schematic view showing a structure of a 3D display apparatus according to an embodiment of the present application;

DETAILED DESCRIPTION OF PREFERRED EMBODIMENTS OF THE DISCLOSURE

Figure 3:
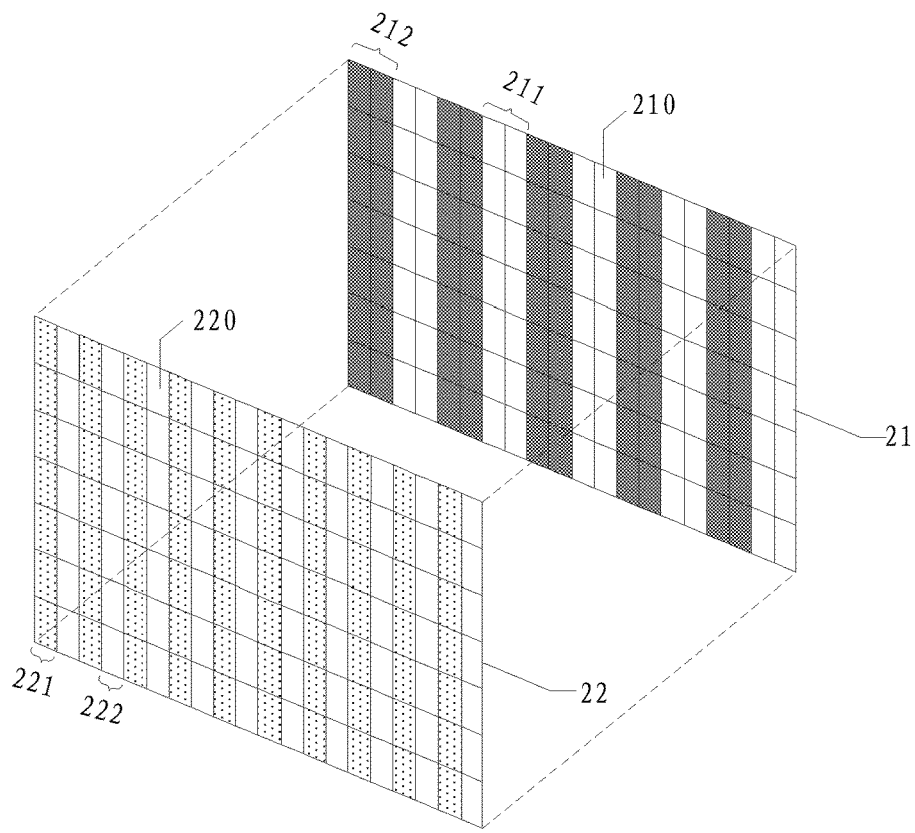
FIG. 3 is a schematic view showing structures of a backlight assembly and a liquid crystal display panel according to an embodiment of the present application.

The specific embodiments of the present application will below be described clearly and entirely with reference to drawings. Apparently, the described embodiments are only some of the embodiments of the present application, instead of all of embodiments. From the embodiments of the present application, the skilled person in the art may obtain other embodiments without any creative efforts. All of these other embodiments fall within the protection scope of the present application.

An embodiment of the present application provides a 3D display apparatus. The 3D display apparatus includes: a backlight assembly which includes a plurality of light emitting units arranged in array to form a plurality of bright stripes and dark stripes arranged alternately by lighting part of the plurality of light emitting units, each of the bright stripes and dark stripes being formed by at least one column of light emitting units; a liquid crystal display panel located at a light exit side of the backlight assembly, the liquid crystal display panel including a plurality of pixel units arranged in array to receive a 3D display signal and display a left eye image of the 3D display signal by a first set of the pixel units and display a right eye image of the 3D display signal by a second set of the pixel units, in which the first set of the pixel units and the second set of the pixel units are arranged alternately and each include at least one column of the pixel units; a location tracking unit configured to acquire a location of a viewer; and a control unit configured to adjust position of the bright stripes and dark stripes formed by the backlight assembly and deflection of liquid crystal of the liquid crystal display panel on the basis of the location of the viewer such that light emitted from the bright stripes is allowed to pass through corresponding first set of the pixel units to be received by left eye of the viewer and light emitted from the bright stripes is allowed to pass through corresponding second set of the pixel units to be received by right eye of the viewer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An embodiment of the present application provides a 3D display apparatus. In an example, as illustrated in FIG. 2, the 3D display apparatus includes: a backlight assembly 21, a liquid crystal display panel 22 located at a light exit side of the backlight assembly 21, a location tracking unit 23 and a control unit 24.

In a further example, as illustrated in FIG. 3, the backlight assembly 21 includes a plurality of light emitting units 210 arranged in array to form a plurality of bright stripes 211 and dark stripes 212 arranged alternately by lighting part of the plurality of light emitting units 210. Each of the bright stripes 211 and dark stripes 212 is formed by at least one column of light emitting units 210.

The liquid crystal display panel 22 includes a plurality of pixel units 220 arranged in array to receive a 3D display signal and display a left eye image of the 3D display signal by a first set 221 of the pixel units and display a right eye image of the 3D display signal by a second set 222 of the pixel units. The first set 221 of the pixel units and the second set 222 of the pixel units are arranged alternately and each include at least one column of the pixel units 220 (FIG. 3 shows that the first set 221 of the pixel units and the second set 222 of the pixel units each include one column of the pixel units 220, by way of an example, however, the embodiments of the present application are not limited to this).

The location tracking unit 23 is configured to acquire a location of a viewer. The location tracking unit 23 may for example be implemented by any known means for catching location in the prior art, such as a camera.

The control unit 24 is configured to adjust position of the bright stripes 211 and dark stripes 212 formed by the backlight assembly 21 and deflection of liquid crystal of the liquid crystal display panel 22 on the basis of the location of the viewer such that a light emitted from the bright stripes 211 passing through corresponding first set 221 of the pixel units is received by the left eye and the light emitted from the bright stripes 211 passing through corresponding second set 222 of the pixel units is received by the right eye.

As an example, each of the dark stripes 212 between adjacent bright stripes 211 and the bright stripes 211 between adjacent dark stripes 212 may include N columns of the light emitting units 210, where N is a positive integer greater than 1 (FIG. 3 shows an example in which N is equal to 2). For example, the number of columns of the light emitting units 210 forming the bright stripes 211 may be equal to that of columns of the light emitting units 210 forming the dark stripes 212.

Figure 4:
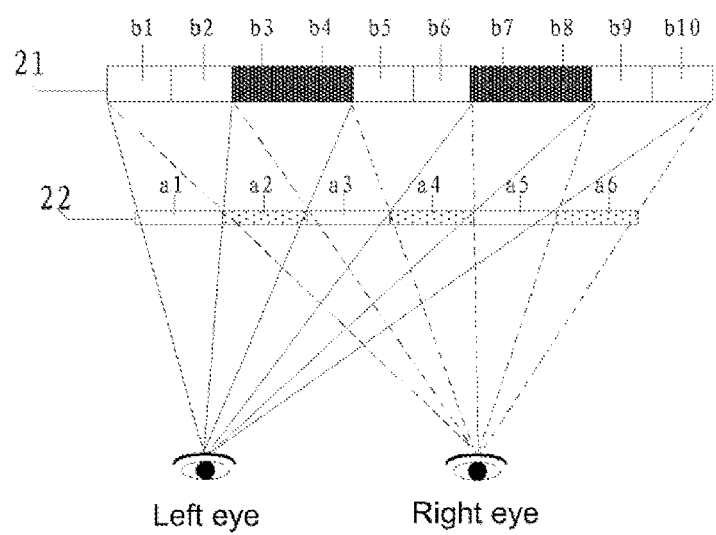
FIG. 4 is a schematic view showing how a 3D display apparatus according to an embodiment of the present application achieves 3D display.

In particular, as shown in FIG. 4, the embodiment is explained with reference to columns a1 to a6 of the pixel units of the liquid crystal display panel 21 corresponding to columns b1 to b10 of the light emitting units of the backlight assembly. In the example, the columns a1, a3, a5 of the pixel units belong to the first set of the pixel units, for the left eye image of a 3D display signal. The columns a2, a4, a6 of the pixel units belong to the second set of the pixel units, for the right eye image of the 3D display signal. The columns b1, b2, b5, b6, b9 and b10 of the light emitting units are lighted to form the bright stripes 211. The columns b3, b4, b7 and b8 of the light emitting units are not lighted to form the dark stripes 212. The light emitted from bright stripes formed by the columns b1, b2 of the light emitting units passing through the column a1 of the pixel units is received by the left eye. The light emitted from bright stripes formed by the columns b1, b2 of the light emitting units passing through the column a2 of the pixel units is received by the right eye. As such, the light emitted from bright stripes formed by the columns b5, b6 of the light emitting units passing through the column a3 of the pixel units is received by the left eye. The light emitted from bright stripes formed by the columns b5, b6 of the light emitting units passing through the column a4 of the pixel units is received by the right eye. The light emitted from bright stripes formed by the columns b9, b10 of the light emitting units passing through the column a5 of the pixel units is received by the left eye. The light emitted from bright stripes formed by the columns b9, b10 of the light emitting units passing through the column a6 of the pixel units is received by the right eye. The columns b3, b4, b7 and b8 of the light emitting units are not lighted to form the dark stripes 212, thus, the left eye cannot receive the light through the columns a2, a4, a6 of the pixel units and the right eye cannot receive the light through the columns a1, a3, a5 of the pixel units. In this way, the image received by the left eye and the image received by the right eye will not disturb each other.

Figure 5:
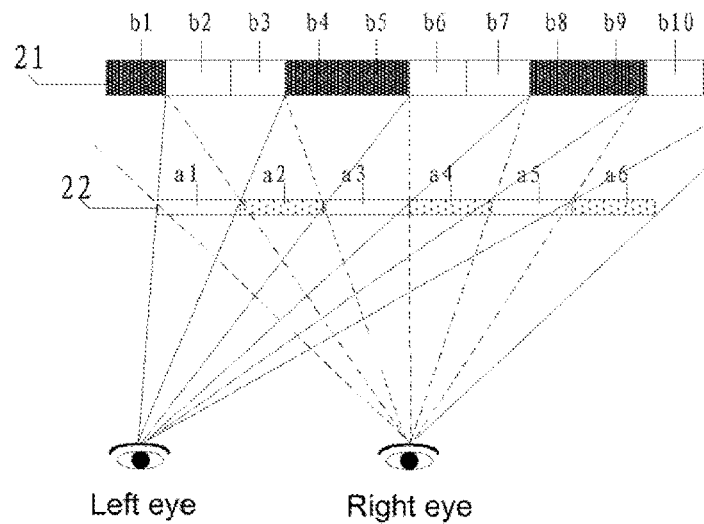
FIG. 5 is a schematic view showing how a 3D display apparatus according to an embodiment of the present application achieves 3D display after a viewer moves.

In a further example, with reference to FIG. 5, when the location of the viewer changes, the location tracking unit 23 acquires the location of the viewer. The control unit 24 adjusts the position of the bright stripes 211 and the dark stripes 212 formed by the backlight assembly 21 on the basis of the location of the viewer. In this circumstance, the columns b2, b3, b6, b7, b10 of the light emitting units of the backlight assembly are lighted to form the bright stripes 211 and the columns b1, b4, b5, b8, b9 of the light emitting units are not lighted to form the dark stripes 212. The light emitted from bright stripes formed by the columns b2, b3 of the light emitting units passing through the column a1 of the pixel units is received by the left eye. The light emitted from bright stripes formed by the columns b2, b3 of the light emitting units passing through the column a2 of the pixel units is received by the right eye. As such, the light emitted from bright stripes formed by the columns b6, b7 of the light emitting units passing through the column a3 of the pixel units is received by the left eye. The light emitted from bright stripes formed by the columns b6, b7 of the light emitting units passing through the column a4 of the pixel units is received by the right eye. The light emitted from bright stripes formed by the column b10 of the light emitting units passing through the column a5 of the pixel units is received by the left eye. The light emitted from bright stripes formed by the column b10 of the light emitting units passing through the column a6 of the pixel units is received by the right eye. The columns b1, b4, b5, b8 and b9 of the light emitting units are not lighted to form the dark stripes 212, thus, the left eye cannot receive the light through the columns a2, a4, a6 of the pixel units and the right eye cannot receive the light through the columns a1, a3, a5 of the pixel units. In this way, the image received by the left eye and the image received by the right eye will still not disturb each other.

The 3D display apparatus provided by the embodiment of the present application includes: a backlight assembly, a liquid crystal display panel located at a light exit side of the backlight assembly, a location tracking unit and a control unit. The backlight assembly includes a plurality of light emitting units arranged in array and may form a plurality of bright stripes and dark stripes arranged alternately by lighting part of the plurality of light emitting units. The liquid crystal display panel may display a left eye image of the 3D display signal by a first set of the pixel units and display a right eye image of the 3D display signal by a second set of the pixel units. The location tracking unit may acquire a location of a viewer. The control unit may adjust position of the bright stripes and dark stripes formed by the backlight assembly and deflection of liquid crystal of the liquid crystal display panel on the basis of the location of the viewer such that a light emitted from the bright stripes passing through corresponding first set of the pixel units is received by left eye and the light emitted from the bright stripes passing through corresponding second set of the pixel units is received by right eye. So, in the embodiment of the present application, when the viewer adjusts his viewing location, the position of the bright stripes and the dark stripes formed by the backlight assembly and deflection of the liquid crystal of the liquid crystal display panel may be adjusted such that the light emitted from the bright stripes passing through the corresponding first set of the pixel units is received by the left eye and the light emitted from the bright stripes passing through the corresponding second set of the pixel units is received by the right eye. That is, in the embodiment of the present application, the left eye image and the right eye image are prevented from being disturbed by each other when the viewer adjusts his viewing location, thus, the viewer for the 3D display apparatus provided by the embodiment of the present application may adjust his viewing location freely.

It should also be noted that, in case that each of the dark stripes 212 between adjacent bright stripes 211 and the bright stripes 211 between adjacent dark stripes 212 may include N columns of the light emitting units 210 (where N is a positive integer greater than 1), in practice, the present application may further allow the 3D display apparatus to achieve continuous viewing adapted for tiny movement of the eyes of the viewer by configuring the specific values of N.

As an example, the light emitting units 210 of the backlight assembly 21 are configured to produce a white light and the liquid crystal display panel 22 includes a color filter layer which includes a red color filter, a green color filter and a blue color filter.

As an example, the backlight assembly 21 may also be configured to produce a red light, a green light and a blue light.

In order to achieve color display function of the 3D display apparatus, when the backlight assembly 22 is configured to produce the white light, the liquid crystal display panel 22 includes the color filter layer correspondingly. The color filter layer at least includes the red color filter, the green color filter and the blue color filter, that is, the liquid crystal display panel at least includes red pixel units, green pixel units and blue pixel units. When the backlight assembly 21 is configured to produce the red light, the green light and the blue light, the liquid crystal display panel 22 may not provide the color filter layer, but only adjust the transmittance for the light with various colors produced by the backlight assembly 21, i.e., the color display function of the 3D display apparatus may be achieved.

In a further example, the light emitting units 210 of the backlight assembly 21 are formed of an OLED (organic light emitting diode) light emitting assembly.

The OLED light emitting assembly may be a PMOLED (Passive-matrix Organic Light Emitting Diode) light emitting assembly or an AMOLED (Active-matrix Organic Light Emitting Diode) light emitting assembly.

Figure 6:
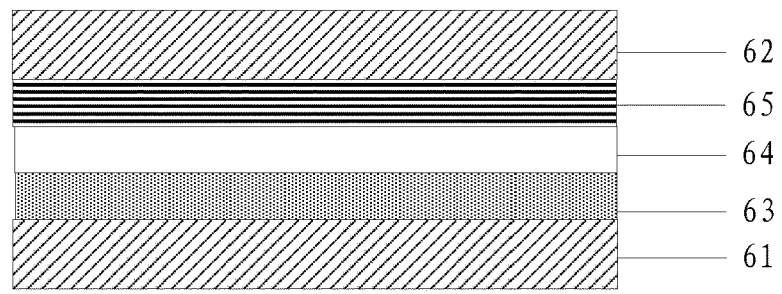
FIG. 6 is a schematic view showing a structure of an OLED according to an embodiment of the present application.

In an example, with reference to FIG. 6, the OLED light emitting assembly may include a first transparent substrate 61, a cathode layer 62, a light emitting layer 63, an anode layer 64 and a second transparent substrate 65. As an example, a driving current may be produced by controlling voltage applied onto the cathode layer 62 and applied onto the anode layer 64, and then may cause the light emitting layer 63 to emit a light.

Several structures of OLED forming the above light emitting units 210 in the above embodiments will be provided below. They will be explained with reference to the example that the dark stripes between adjacent bright stripes and the bright stripes between adjacent dark stripes each include four columns of the light emitting units.

Figure 7:
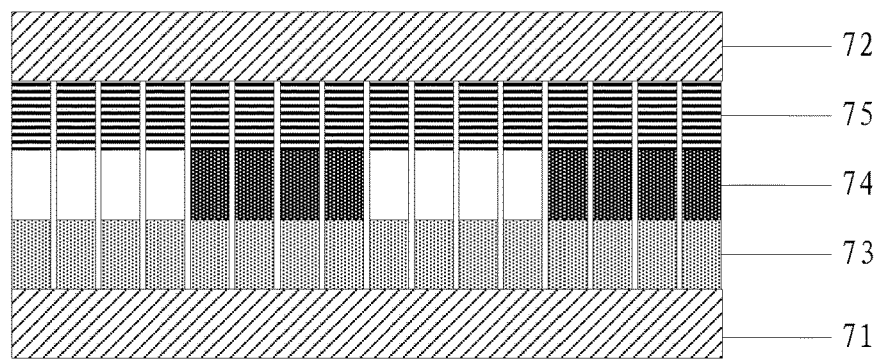
FIG. 7 is a schematic view showing a structure of an OLED according to an embodiment of the present application.

In an example, the light emitting units 210 are arranged in parallel in the OLED light emitting assembly. In particular, as shown in FIG. 7, the OLED light emitting assembly includes a first transparent substrate 71 and a second transparent substrate 72 and respective light emitting units arranged in parallel between the first transparent substrate 71 and the second transparent substrate 72. And each of the light emitting units 210 includes a cathode 73, an anode 75 and an organic electroluminescent portion 74 between the cathode 73 and the anode 75. As an example, the anode of each of the light emitting units in the OLED light emitting assembly is separated from that of any other one of the light emitting units in the OLED light emitting assembly and the cathode of each of the light emitting units in the OLED light emitting assembly is separated from that of any other one of the light emitting units in the OLED light emitting assembly. The respective light emitting units may be controlled to be in a lighted state or in unlighted state by controlling the voltage applied onto the anodes and the cathodes of the respective light emitting units.

Figure 8:
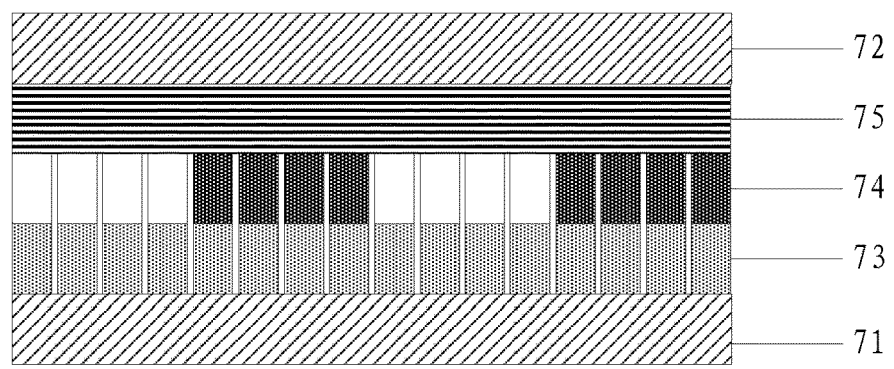
FIG. 8 is a schematic view showing a structure of an OLED according to an embodiment of the present application.

In an example, as shown in FIG. 8, the light emitting units 210 are also arranged in parallel in the OLED light emitting assembly. It has a structure similar to that of the OLED light emitting assembly shown in FIG. 7. The OLED light emitting assembly also includes a first transparent substrate 71 and a second transparent substrate 72 and respective light emitting units arranged in parallel between the first transparent substrate 71 and the second transparent substrate 72. And each of the light emitting units 210 includes a cathode 73, an anode 75 and an organic electroluminescent portion 74 between the cathode 73 and the anode 75. The example shown in FIG. 8 is distinguished from that shown in FIG. 7 in that the anode of each of the light emitting units in the OLED light emitting assembly is separated from that of any other one of the light emitting units in the OLED light emitting assembly but the cathodes of the light emitting units in the OLED light emitting assembly are electrically connected with each other. Alternatively, it may also be arranged that the cathode of each of the light emitting units in the OLED light emitting assembly is separated from that of any other one of the light emitting units in the OLED light emitting assembly and the anodes of the light emitting units in the OLED light emitting assembly are electrically connected with each other. A certain voltage is applied onto the electrodes of the respective light emitting units electrically connected with each other and the respective light emitting units may be controlled to be in a lighted state or in unlighted state by controlling the voltage applied onto one side on which electrodes are separated from each other.

In an example, the OLED light emitting assembly includes: a first light emitting module 10 forming odd columns of light emitting units of the backlight assembly 21; and a second light emitting module 20 forming even columns of light emitting units of the backlight assembly 21.

Figure 9:
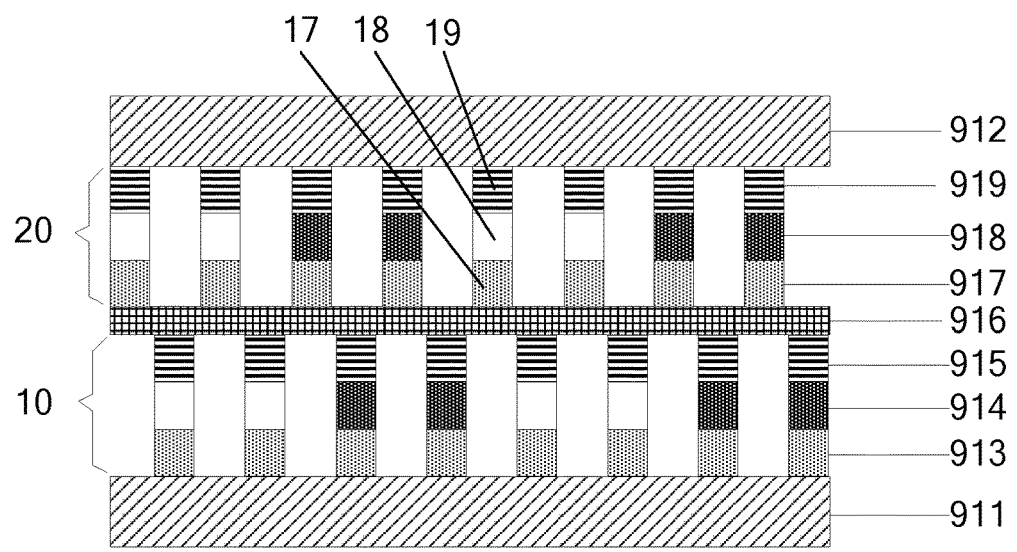
FIG. 9 is a schematic view showing a structure of an OLED according to an embodiment of the present application.

As an example, as shown in FIG. 9, the OLED light emitting assembly further includes: a first transparent substrate 911, a second transparent substrate 912 and an insulation layer 916 located between the first transparent substrate 911 and the second transparent substrate 912. The first light emitting module 10 is located between the first transparent substrate 911 and the insulation layer 916. The second light emitting module 20 is located between the insulation layer 916 and the second transparent substrate 912. The first light emitting module 10 includes a first cathode layer 913, a first organic electroluminescent layer 914 and a first anode layer 915 arranged sequentially between the first transparent substrate 911 and the insulation layer 916. The second light emitting module 20 includes a second cathode layer 917, a second organic electroluminescent layer 918 and a second anode layer 919 arranged sequentially between the insulation layer 916 and the second transparent substrate 912.

Each of the light emitting units includes a cathode 17, an anode 19 and an organic electroluminescent portion 18 located between the cathode 17 and the anode 19. The cathode, the organic electroluminescent portion and the anode of each light emitting unit in odd columns of light emitting units of the backlight assembly are formed by the first cathode layer 913, the first organic electroluminescent layer 914 and the first anode layer 915 respectively. The cathode, the organic electroluminescent portion and the anode of each light emitting unit in even columns of light emitting units of the backlight assembly are formed by the second cathode layer 917, the second organic electroluminescent layer 918 and the second anode layer 919 respectively. In a same one of the first light emitting module and the second light emitting module, the anode of each of the light emitting units is separated from that of any other one of the light emitting units and the cathodes of each of the light emitting units is separated from that of any other one of the light emitting units.

In an example, the OLED light emitting assembly includes: a first light emitting module 10 forming odd columns of light emitting units of the backlight assembly 21; and a second light emitting module 20 forming even columns of light emitting units of the backlight assembly 21.

Figure 10:
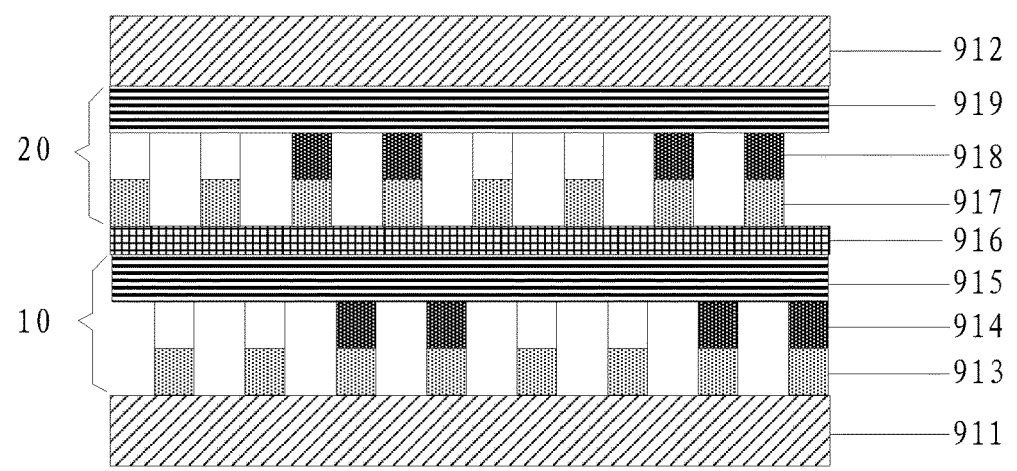
FIG. 10 is a schematic view showing a structure of an OLED according to an embodiment of the present application.

As an example, as illustrated in FIG. 10, similar to the OLED light emitting assembly shown in FIG. 9, the OLED light emitting assembly also includes: a first transparent substrate 911, a second transparent substrate 912 and an insulation layer 916 located between the first transparent substrate 911 and the second transparent substrate 912. The first light emitting module 10 is located between the first transparent substrate 911 and the insulation layer 916. The second light emitting module 20 is located between the insulation layer 916 and the second transparent substrate 912. The first light emitting module 10 includes a first cathode layer 913, a first organic electroluminescent layer 914 and a first anode layer 915 arranged sequentially between the first transparent substrate 911 and the insulation layer 916. The second light emitting module 20 includes a second cathode layer 917, a second organic electroluminescent layer 918 and a second anode layer 919 arranged sequentially between the insulation layer 916 and the second transparent substrate 912. The OLED light emitting assembly shown in FIG. 10 is distinguished from that shown in FIG. 9 in that, in a same one of the first light emitting module and the second light emitting module, the anode of each of the light emitting units is separated from that of any other one of the light emitting units and the cathodes of the light emitting units are electrically connected with each other. As such, alternatively, in a same one of the first light emitting module and the second light emitting module, the cathode of each of the light emitting units may be separated from that of any other one of the light emitting units and the anodes of the light emitting units may be electrically connected with each other.

In an example, the OLED light emitting assembly includes: a first light emitting module 30 forming $(3n)^{th}$ columns of light emitting units of the backlight assembly 21; a second light emitting module 40 forming $(3n-1)^{th}$ columns of light emitting units of the backlight assembly 21; and a third light emitting module 50 forming $(3n-2)^{th}$ columns of light emitting units of the backlight assembly 21, where n is a positive integer.

Figure 11:
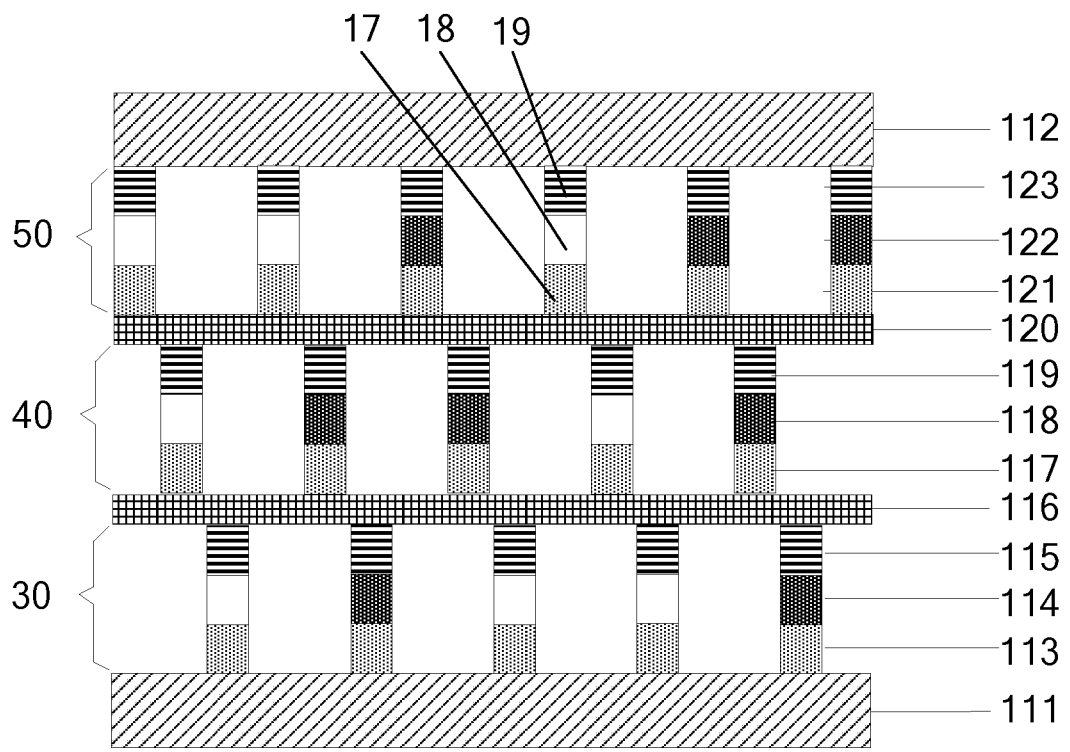
FIG. 11 is a schematic view showing a structure of an OLED according to an embodiment of the present application.

As an example, as illustrated in FIG. 11, the OLED light emitting assembly further includes: a first transparent substrate 111, a second transparent substrate 112 and a first insulation layer 116 and a second insulation layer 120 located between the first transparent substrate 111 and the second transparent substrate 112. The first light emitting module 30 is located between the first transparent substrate 111 and the first insulation layer 116. The second light emitting module 40 is located between the first insulation layer 116 and the second insulation layer 120. The third light emitting module 50 is located between the second insulation layer 120 and the second transparent substrate 112. The first light emitting module 30 includes a first cathode layer 113, a first organic electroluminescent layer 114 and a first anode layer 115 arranged sequentially between the first transparent substrate 111 and the first insulation layer 116. The second light emitting module 40 includes a second cathode layer 117, a second organic electroluminescent layer 118 and a second anode layer 119 arranged sequentially between the first insulation layer 116 and the second insulation layer 120. The third light emitting module 50 includes a third cathode layer 121, a third organic electroluminescent layer 122 and a third anode layer 123 arranged sequentially between the second insulation layer 120 and the second transparent substrate 112.

Each of the light emitting units includes a cathode 17, an anode 19 and an organic electroluminescent portion 18 located between the cathode and the anode. The cathode, the organic electroluminescent portion and the anode of each light emitting unit in the $(3n)^{th}$ columns of light emitting units of the backlight assembly are formed by the first cathode layer, the first organic electroluminescent layer and the first anode layer respectively. The cathode, the organic electroluminescent portion and the anode of each light emitting unit in the $(3n-1)^{th}$ columns of light emitting units of the backlight assembly are formed by the second cathode layer, the second organic electroluminescent layer and the second anode layer respectively, and the cathode, the organic electroluminescent portion and the anode of each light emitting unit in the $(3n-2)^{th}$ columns of light emitting units of the backlight assembly are formed by the third cathode layer, the third organic electroluminescent layer and the third anode layer respectively. In a same one of the first light emitting module, the second light emitting module and the third light emitting module, the anode of each of the light emitting units is separated from that of any other one of the light emitting units and the cathode of each of the light emitting units is separated from that of any other one of the light emitting units.

In an example, the OLED light emitting assembly includes: a first light emitting module 30 forming $(3n)^{th}$ columns of light emitting units of the backlight assembly 21; a second light emitting module 40 forming $(3n-1)^{th}$ columns of light emitting units of the backlight assembly 21; and a third light emitting module 50 forming $(3n-2)^{th}$ columns of light emitting units of the backlight assembly 21, where n is a positive integer.

Figure 12:
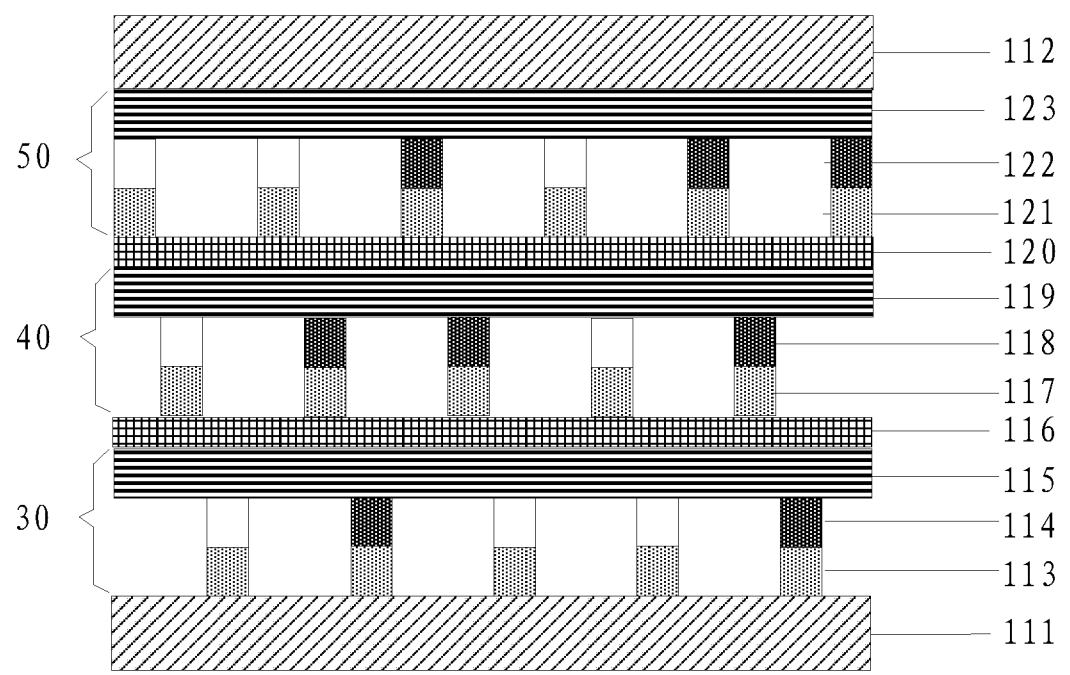
FIG. 12 is a schematic view showing a structure of an OLED according to an embodiment of the present application.

As an example, as illustrated in FIG. 12, the OLED light emitting assembly further includes: a first transparent substrate 111, a second transparent substrate 112 and a first insulation layer 116 and a second insulation layer 120 located between the first transparent substrate 111 and the second transparent substrate 112. The first light emitting module 30 is located between the first transparent substrate 111 and the first insulation layer 116. The second light emitting module 40 is located between the first insulation layer 116 and the second insulation layer 120. The third light emitting module 50 is located between the second insulation layer 120 and the second transparent substrate 112. The first light emitting module 30 includes a first cathode layer 113, a first organic electroluminescent layer 114 and a first anode layer 115 arranged sequentially between the first transparent substrate 111 and the first insulation layer 116. The second light emitting module 40 includes a second cathode layer 117, a second organic electroluminescent layer 118 and a second anode layer 119 arranged sequentially between the first insulation layer 116 and the second insulation layer 120. The third light emitting module 50 includes a third cathode layer 121, a third organic electroluminescent layer 122 and a third anode layer 123 arranged sequentially between the second insulation layer 120 and the second transparent substrate 112. The OLED light emitting assembly shown in FIG. 12 is distinguished from that shown in FIG. 11 in that, in a same one of the first light emitting module, the second light emitting module and the third light emitting module, the anode of each of the light emitting units is separated from that of any other one of the light emitting units and the cathodes of the light emitting units re electrically connected with each other. As such, alternatively, in a same one of the first light emitting module, the second light emitting module and the third light emitting module, the cathode of each of the light emitting units may be separated from that of any other one of the light emitting units and the anodes of the light emitting units may be electrically connected with each other.

Figure 13:
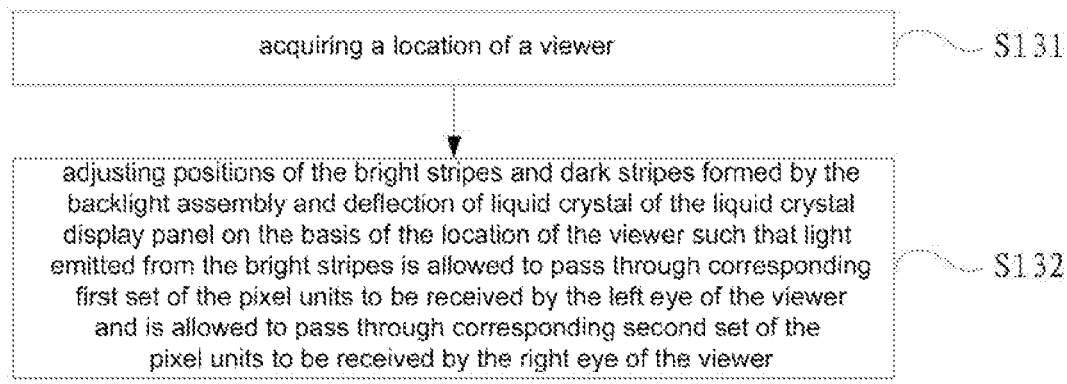
FIG. 13 is a flow chart of a method for driving a 3D display apparatus according to an embodiment of the present application.

It should be noted that the above embodiments are only some of the preferred embodiments of the present application, but embodiments of the present application are not limited to this. In view of this, the structure of the OLED device in the above embodiments of the present application may be converted into other structures. For example, the columns of pixels formed by the OLED devices in the structure shown in FIG. 12 or 13 are changed. Further, for example, the first light emitting module and the second light emitting module share a same cathode layer or a same anode layer in the structure shown in FIG. 10 or FIG. 11.

A further embodiment of the present application provides a method for driving a 3D display apparatus provided by any one of the above embodiments. In particular, with reference to FIG. 13, the method includes:

step S131, of acquiring a location of a viewer;

step S132, of adjusting position of the bright stripes and dark stripes formed by the backlight assembly and deflection of liquid crystal of the liquid crystal display panel on the basis of the location of the viewer such that a light emitted from the bright stripes is allowed to pass through corresponding first set of the pixel units is received by left eye of the viewer and light emitted from the bright stripes is allowed to pass through corresponding second set of the pixel units is received by right eye of the viewer.

The method for driving the 3D display apparatus provided by the embodiment of the present application may acquire a location of a viewer and adjust position of the bright stripes and dark stripes formed by the backlight assembly and deflection of liquid crystal of the liquid crystal display panel on the basis of the location of the viewer such that a light emitted from the bright stripes passing through corresponding first set of the pixel units is received by the left eye and the light emitted from the bright stripes passing through corresponding second set of the pixel units is received by the right eye. So, in the embodiment of the present application, when the viewer adjusts his viewing location, the position of the bright stripes and the dark stripes formed by the backlight assembly and deflection of the liquid crystal of the liquid crystal display panel may be adjusted such that the light emitted from the bright stripes passing through the corresponding first set of the pixel units is received by the left eye and the light emitted from the bright stripes passing through the corresponding second set of the pixel units is received by the right eye. That is, the viewer may adjust his viewing location freely.

As discussed above, the above embodiments are only exemplary embodiments of the present application, but the protection scope of the present application is not limited to this. Various alternations or modifications made by any skilled person in the art without departing from the scope of the disclosure will also fall within the protect scope of the present application. Therefore, the protection scope of the present application should be defined by the appended claims.

What is claimed is:

1. A 3D display apparatus comprising:
   a backlight assembly, which comprises a plurality of light emitting units arranged in array to form a plurality of bright stripes and dark stripes arranged alternately by lighting part of the plurality of light emitting units, each of the bright stripes and dark stripes being formed by at least one column of light emitting units;
   a liquid crystal display panel located at a light exit side of the backlight assembly, the liquid crystal display panel comprising a plurality of pixel units arranged in array to receive a 3D display signal and display a left eye image of the 3D display signal by a first set of the pixel units and display a right eye image of the 3D display signal by a second set of the pixel units, wherein the first set of the pixel units and the second set of the pixel units are arranged alternately and each comprises at least one column of the pixel units;
   a location tracking unit configured to acquire a location of a viewer; and
   a control unit configured to adjust positions of the bright stripes and dark stripes formed by the backlight assembly and deflection of liquid crystal of the liquid crystal display panel on the basis of the location of the viewer such that light emitted from the bright stripes is allowed to pass through corresponding first set of the pixel units to be received by left eye of the viewer and light emitted from the bright stripes is allowed to pass through corresponding second set of the pixel units to be received by right eye of the viewer,
   wherein the light emitting units of the backlight assembly are formed of an OLED light emitting assembly, and wherein the OLED light emitting assembly comprises:
   a first light emitting module forming (3n)th columns of light emitting units of the backlight assembly;
   a second light emitting module forming (3n−1)th columns of light emitting units of the backlight assembly; and
   a third light emitting module forming (3n−2)th columns of light emitting units of the backlight assembly,
   wherein n is a positive integer.

2. The 3D display apparatus according to claim 1, wherein each of the dark stripes between adjacent bright stripes and the bright stripes between adjacent dark stripes comprises N columns of the light emitting units, where N is a positive integer greater than 1.

3. The 3D display apparatus according to claim 1, wherein the light emitting units of the backlight assembly are configured to produce white light and the liquid crystal display panel comprises a color filter layer which comprises a red color filter, a green color filter and a blue color filter; or
   the light emitting units of the backlight assembly are configured to produce red light, green light and blue light.

4. The 3D display apparatus according to claim 1, wherein the OLED light emitting assembly comprises a first transparent substrate and a second transparent substrate as well as respective light emitting units arranged in parallel between the first transparent substrate and the second transparent substrate, and wherein each of the light emitting units comprises a cathode, an anode and an organic electroluminescent portion between the cathode and the anode.

5. The 3D display apparatus according to claim 4, wherein within the OLED light emitting assembly,
   the anode of each of the light emitting units is separated from that of any other one of the light emitting units and the cathode of each of the light emitting units is separated from that of any other one of the light emitting units; or
   the anode of each of the light emitting units is separated from that of any other one of the light emitting units and the cathodes of the light emitting units are electrically connected with each other; or
   the cathode of each of the light emitting units is separated from that of any other one of the light emitting units and the anodes of the light emitting units are electrically connected with each other.

6. The 3D display apparatus according to claim 1, wherein the OLED light emitting assembly further comprises: a first transparent substrate, a second transparent substrate, and a first insulation layer and a second insulation layer located between the first transparent substrate and the second transparent substrate, the first light emitting module being located between the first transparent substrate and the first insulation layer, the second light emitting module being located between the first insulation layer and the second insulation layer, the third light emitting module being located between the second insulation layer and the second transparent substrate, and
   wherein the first light emitting module comprises a first cathode layer, a first organic electroluminescent layer and a first anode layer arranged sequentially between the first transparent substrate and the first insulation layer, and the second light emitting module comprises a second cathode layer, a second organic electroluminescent layer and a second anode layer arranged sequentially between the first insulation layer and the second insulation layer, and the third light emitting module comprises a third cathode layer, a third organic electroluminescent layer and a third anode layer arranged sequentially between the second insulation layer and the second transparent substrate.

7. The 3D display apparatus according to claim 6, wherein each of the light emitting units comprises a cathode, an anode and an organic electroluminescent portion located between the cathode and the anode, the cathode, the organic electroluminescent portion and the anode of each light emitting unit in the $(3n)^{th}$ columns of light emitting units of the backlight assembly are formed by the first cathode layer, the first organic electroluminescent layer and the first anode layer respectively, the cathode, the organic electroluminescent portion and the anode of each light emitting unit in the $(3n-1)^{th}$ columns of light emitting units of the backlight assembly are formed by the second cathode layer, the second organic electroluminescent layer and the second anode layer respectively, and the cathode, the organic electroluminescent portion and the anode of each light emitting unit in the $(3n-2)^{th}$ columns of light emitting units of the backlight assembly are formed by the third cathode layer, the third organic electroluminescent layer and the third anode layer respectively;

wherein in a same one of the first light emitting module, the second light emitting module and the third light emitting module, the anode of each of the light emitting units is separated from that of any other one of the light emitting units and the cathode of each of the light emitting units is separated from that of any other one of the light emitting units; or wherein in a same one of the first light emitting module, the second light emitting module and the third light emitting module, the anode of each of the light emitting units is separated from that of any other one of the light emitting units and the cathodes of the light emitting units are electrically connected with each other; or wherein in a same one of the first light emitting module, the second light emitting module and the third light emitting module, the cathode of each of the light emitting units is separated from that of any other one of the light emitting units and the anodes of the light emitting units are electrically connected with each other.

8. The 3D display apparatus according to claim 1, wherein the OLED light emitting assembly is a PMOLED light emitting assembly or an AMOLED light emitting assembly.

9. A method for driving the 3D display apparatus according to claim 1, the method comprising:

acquiring a location of a viewer;

adjusting positions of the bright stripes and dark stripes formed by the backlight assembly and deflection of liquid crystal of the liquid crystal display panel on the basis of the location of the viewer such that light emitted from the bright stripes is allowed to pass through corresponding first set of the pixel units to be received by the left eye of the viewer and light emitted from the bright stripes is allowed to pass through corresponding second set of the pixel units to be received by the right eye of the viewer.

10. The 3D display apparatus according to claim 4, wherein the OLED light emitting assembly is a PMOLED light emitting assembly or an AMOLED light emitting assembly.

11. The 3D display apparatus according to claim 5, wherein the OLED light emitting assembly is a PMOLED light emitting assembly or an AMOLED light emitting assembly.

* * * * *